US011258407B2

(12) United States Patent
Bhatia

(10) Patent No.: US 11,258,407 B2
(45) Date of Patent: Feb. 22, 2022

(54) AMPLIFIER WITH IMPROVED ISOLATION

(71) Applicant: TEXAS INSTRUMENTS INCORPORATED, Dallas, TX (US)

(72) Inventor: Karan Singh Bhatia, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 80 days.

(21) Appl. No.: 16/785,725

(22) Filed: Feb. 10, 2020

(65) Prior Publication Data

US 2021/0249994 A1    Aug. 12, 2021

(51) Int. Cl.
*H03F 3/45* (2006.01)
*H03F 1/22* (2006.01)
*H03F 1/02* (2006.01)
*H03F 1/56* (2006.01)

(52) U.S. Cl.
CPC ............. *H03F 1/0211* (2013.01); *H03F 1/56* (2013.01); *H03F 2200/451* (2013.01)

(58) Field of Classification Search
CPC . H03F 1/22; H03F 1/223; H03F 1/226; H03F 3/45; H03F 2200/534; H03F 2200/541; H03F 3/72
USPC .................... 330/188, 195, 252, 253, 311, 51
See application file for complete search history.

(56) References Cited

U.S. PATENT DOCUMENTS

| RE31,545 | E | * | 3/1984 | Quinn | ....................... H03F 1/32 330/149 |
| 4,692,712 | A | | 9/1987 | Quinn | |
| 2006/0284670 | A1 | | 12/2006 | Eid et al. | |
| 2012/0112835 | A1 | * | 5/2012 | Comeau | .............. H03F 3/45089 330/252 |
| 2018/0026585 | A1 | | 1/2018 | Ali et al. | |
| 2018/0269840 | A1 | | 9/2018 | Dandu et al. | |

OTHER PUBLICATIONS

Notification of Transmittal of the International Search Report and the Written Opinion of the International Searching Authority, or the Declaration; PCT/US 2021/016001; dated Apr. 8, 2021'8 pages.

* cited by examiner

*Primary Examiner* — Steven J Mottola
(74) *Attorney, Agent, or Firm* — Ebby Abraham; Charles A. Brill; Frank D. Cimino

(57) ABSTRACT

An amplifier comprises a common emitter stage coupled to a first and a second input, a common base stage coupled to the common emitter stage and to a first and a second output, and a cancellation path coupled to the common emitter stage and the common base stage and to the first and second outputs. The cancellation path generates a first cancellation signal that is 180 degrees out of phase with a first leakage signal at the first output and a second cancellation signal that is 180 degrees out of phase with a second leakage signal at the second output. The cancellation path comprises a first cancellation transistor coupled to the common emitter stage and the common base stage and to the first output and a second cancellation transistor coupled to the common emitter stage and the common base stage and to the second output.

18 Claims, 10 Drawing Sheets

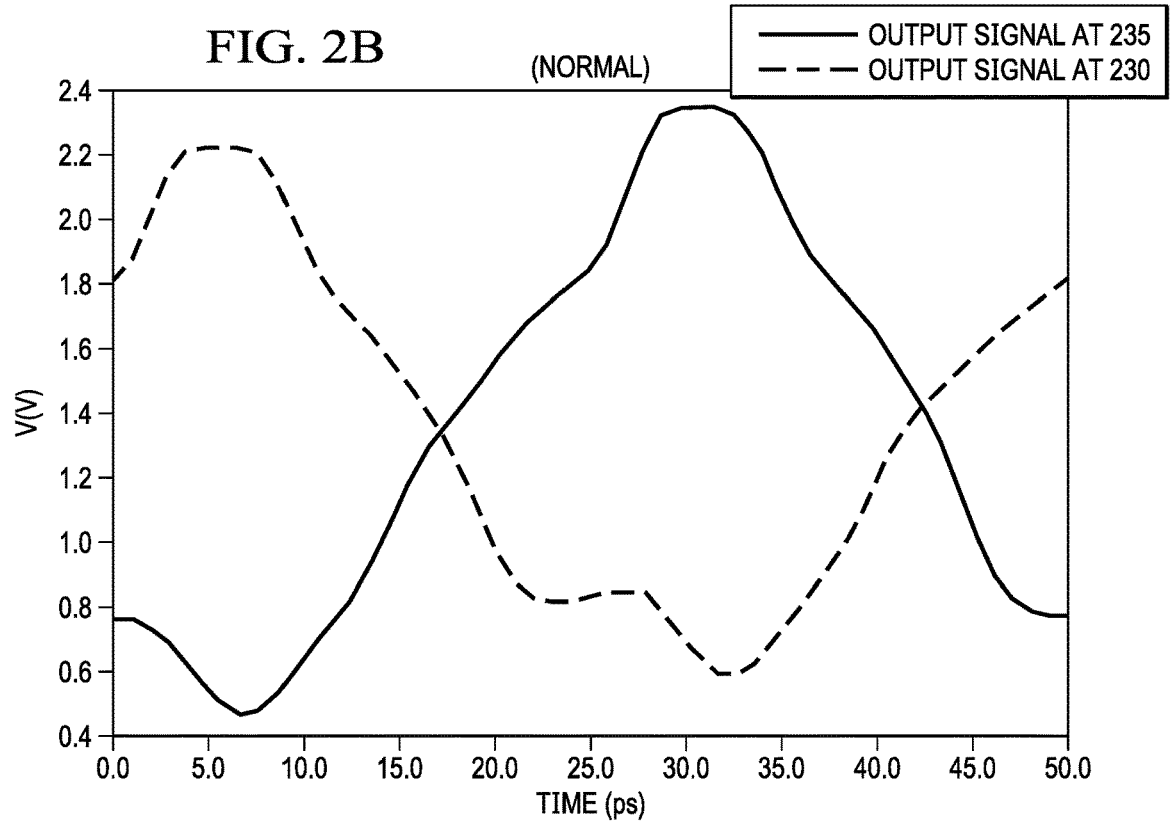
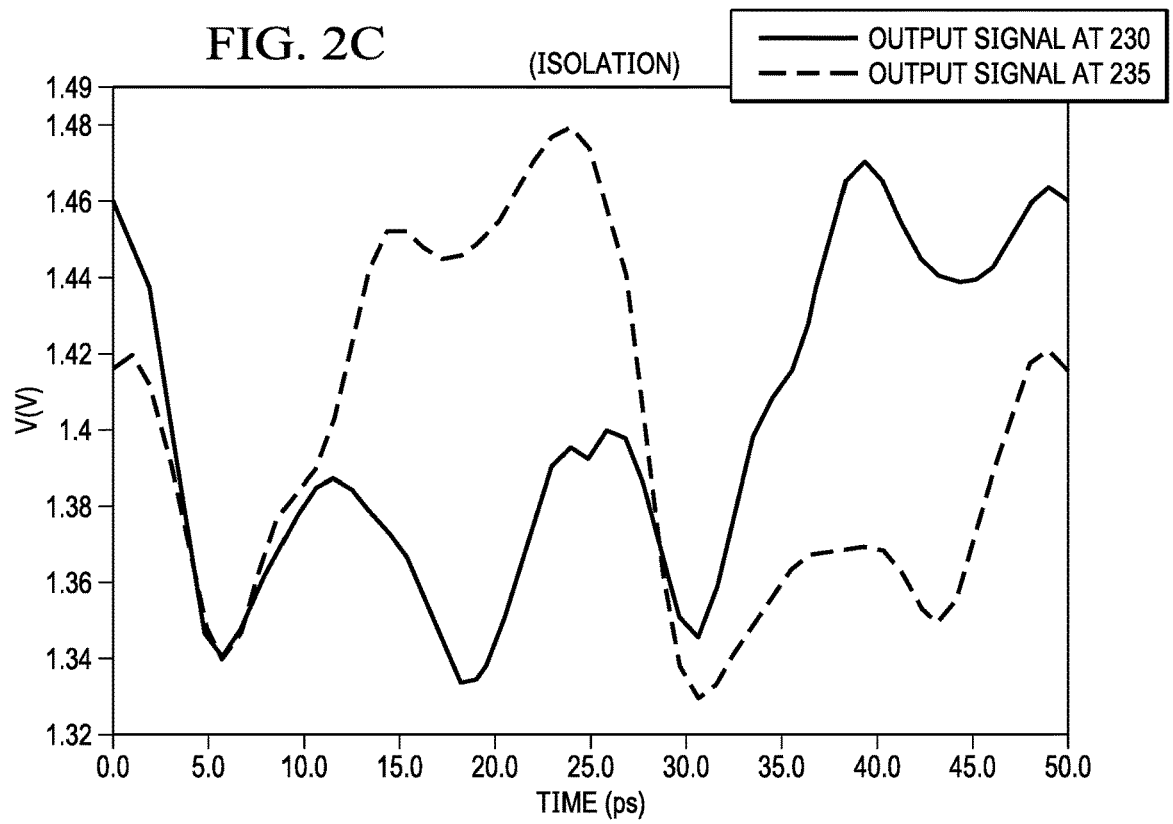

AMPLIFIER WITH IMPROVED ISOLATION

BACKGROUND

Many radio frequency front-end architectures use amplifiers to combine, split, and isolate various parts of the signal path to support multiple modes of operation. For example, amplifiers able to turn off and isolate a particular signal path can be used to reconfigure an in-phase and quadrature signal receiver into a real signal only receiver to reduce power consumption, to select particular receiver channels for mufti-channel radios, to select particular clock signals or local oscillator signals between multiple sources, and as a replacement for conventional switches in transmitter and receiver paths in time division multiplexing systems. However, parasitic capacitances of transistors can cause signal leakage between signal paths, which makes isolating one signal path from another difficult at millimeter (mm) wave frequencies. Further, conventional signal multiplexing schemes can experience device reliability issues.

SUMMARY

In some implementations, an amplifier comprises six transistors. The first transistor is coupled to a first input, and the second transistor is coupled to a second input. The third transistor is coupled to the first transistor and to a first output, and the fourth transistor is coupled to the second transistor and to a second output. The fifth transistor is coupled to the first and third transistors and to the second output, and the sixth transistor is coupled to the second and fourth transistors and to the first output. Characteristics of the fifth transistor such as threshold voltage, geometry, rotation, and biasing are chosen to match the corresponding characteristics of the fourth transistor. Similarly, characteristics of the sixth transistor are chosen to match the corresponding characteristics of the third transistor.

In some implementations, the fifth and sixth transistors are biased to be on while the amplifier operates in an isolation mode and biased to be off while the amplifier does not operate in the isolation mode. In some examples, the fifth and sixth transistors comprise metal oxide semiconductor field effect transistors and are biased such that a gate to drain voltage of the fifth and sixth transistors does not cause a gate oxide breakdown in the fifth and sixth transistors.

BRIEF DESCRIPTION OF THE DRAWINGS

For a detailed description of various examples, reference will now be made to the accompanying drawings in which:

FIGS. 2A-C illustrate a cascode amplifier and plots of the amplifier output signals in normal and isolation modes of operation.

DETAILED DESCRIPTION

The disclosed amplifier actively cancels radio frequency (RF) leakage signals in an isolation operating mode by generating replica signals that are 180 degrees out of phase with the leakage signals. The disclosed amplifiers provide improved signal isolation without changing the input impedance of the amplifiers and without substantial increases in power consumption and semiconductor die area occupied by the amplifiers. An amplifier as disclosed herein includes six transistors. A first transistor is coupled to a first input, and a second transistor is coupled to a second input. A third transistor is coupled to the first transistor and to a first output. A fourth transistor is coupled to the second transistor and to a second output.

A fifth transistor is coupled to the first and third transistors and to the second output and generates a replica signal that is 180 degrees out of phase with the signal leakage through the second and fourth transistors, cancelling it. A sixth transistor is coupled to the second and fourth transistors and to the first output and generates a replica signal that is 180 degrees out of phase with the signal leakage through the first and third transistors, cancelling it. The fifth and sixth transistors are biased to be off in a normal operating mode and on in an isolation operating mode.

Figure 1A:
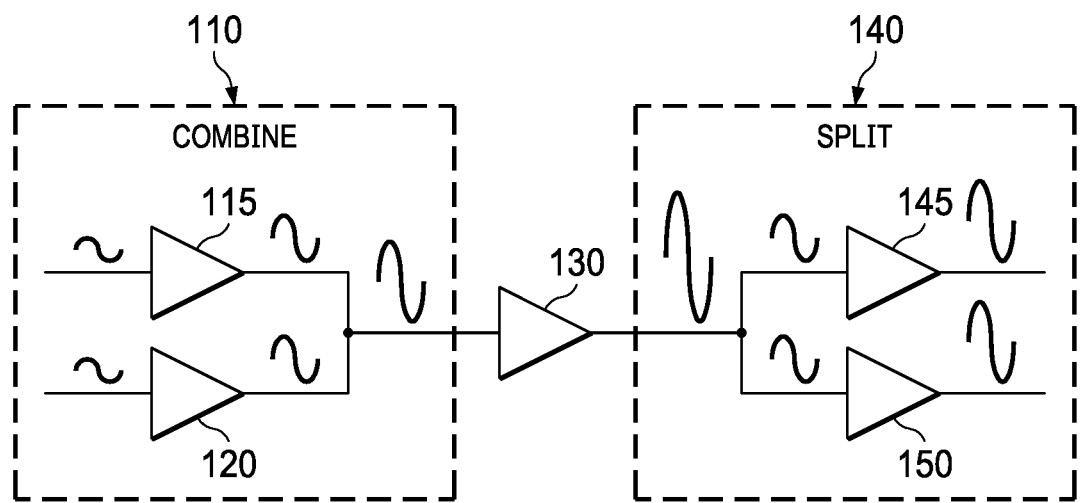
FIGS. 1A-B illustrate example signal paths using amplifiers to perform signal combining, splitting, and isolating.
Figure 1B:
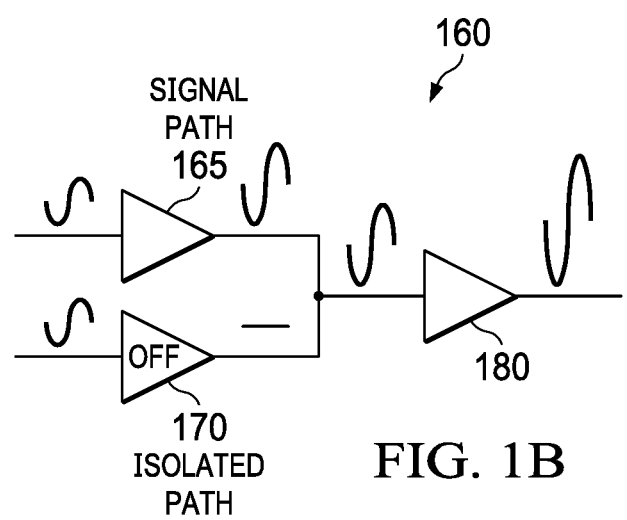

FIGS. 1A-B illustrate example signal paths using amplifiers to perform signal combining, splitting, and isolating. FIG. 1A illustrates a signal combining stage 110 and a signal splitting stage 140. Signal combining stage 110 includes amplifiers 115 and 120, which amplify their respective input signals and input the amplified output signals to the single input of amplifier 130. The combined signal is amplified in amplifier 130. In signal splitting stage 140, the output of amplifier 130 is provided to both amplifiers 145 and 150, splitting the combined signal into two input signals. Amplifiers 145 and 150 amplify the respective input signals.

FIG. 1B illustrates a signal isolating stage 160. In many front-end architectures, signal paths are modified in different modes of operation to implement different signal functions. For example, the signal combining stage 110 is modified in an isolation mode of operation to implement a signal isolating stage 160. Amplifier 170 is placed in an isolation mode, causing the input to amplifier 180 to be the output of amplifier 165 alone, without contribution from amplifier 170. However, isolating one signal path from another can be challenging at frequencies above 20 gigahertz (GHz). Parasitic capacitances of transistors in the amplifiers can cause signal leakage between signal paths even in isolation modes of operation, and conventional signal multiplexing schemes can experience device reliability issues.

Figure 2A:
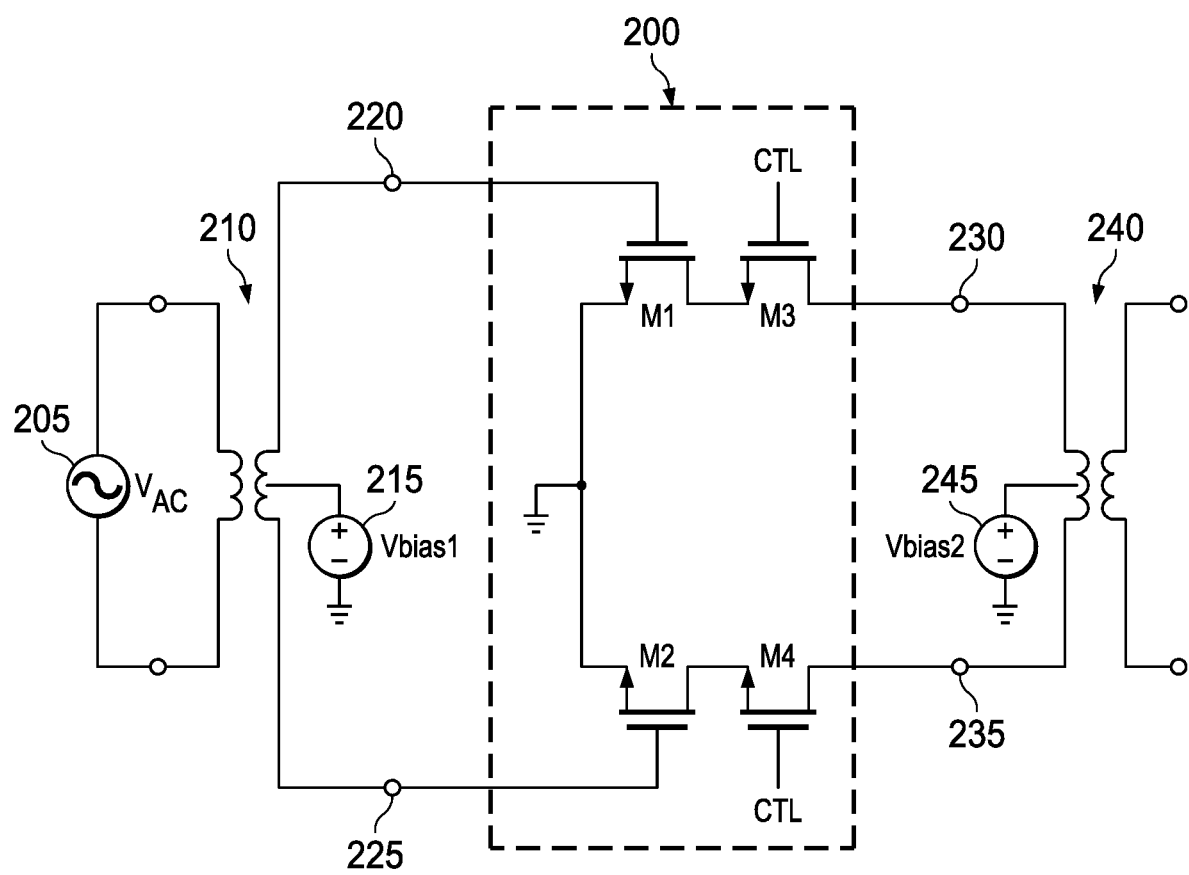

FIGS. 2A-C illustrate a cascode amplifier 200 and plots of the amplifier output signals in normal and isolation modes of operation. FIG. 2A illustrates cascode amplifier 200. The signal source 205 is coupled to the primary winding of transformer 210. The secondary winding of transformer 210 is coupled to the inputs 220 and 225 of amplifier 200. In a normal operating mode, a first biasing voltage source 215 biases the secondary winding of transformer 210 by a voltage Vbias1. In an isolation operating mode, the first biasing voltage source 215 couples the secondary winding of transformer 210 to ground. The outputs 230 and 235 of amplifier 200 are coupled to the primary winding of transformer 240, which is biased by a voltage Vbias2 245 that is constant between normal and isolation operating modes.

Amplifier 200 includes transistors M1-M4, which are metal oxide semiconductor field-effect transistors (MOSFETs). M1-M4 are n-type MOSFETs (NMOS) in this example. In other examples, one or more of M1-M4 are p-type MOSFETs (PMOS) or bipolar junction transistors. A bipolar junction transistor includes a base corresponding to the gate terminal, and a collector and an emitter corresponding to the drain and source terminals. The base of a bipolar junction transistor and the gate terminal of a MOSFET are also called control inputs. The collector and emitter of a bipolar junction transistor and the drain and source terminals of a MOSFET are also called current terminals.

The gate terminal of M1 is coupled to input 220 and the gate terminal of M2 is coupled to input 225. The source terminals of M1 and M2 are coupled to ground in this implementation. In other examples, the source terminals of M1 and M2 are coupled to a current source. The source terminal of M3 is coupled to the drain terminal of M1, and the source terminal of M4 is coupled to the drain terminal of M2. The gate terminals of M3 and M4 receive a control signal CTL, which biases M3 and M4 to be turned on in a normal operating mode and couples the gate terminals of M3 and M4 to ground in an isolation operating mode. The drain terminal of M3 is coupled to output 230, and the drain terminal of M4 is coupled to output 235.

FIG. 2B shows a plot of the amplifier output signals at outputs 230 and 235 in a normal operating mode. M3 and M4 are turned on, and the secondary winding of transformer 210 is biased to Vbias1. The voltage swing of the output signals can be as high as 2.4V. FIG. 2C shows a plot of the amplifier output signals at outputs 230 and 235 in an isolation operating mode. The secondary winding of transformer 210 and the gate terminals of M1-M4 are biased to ground. Amplifier 200 provides approximately 25 decibels (dB) of isolation. However, RF signal leakage at outputs 230 and 235 can have an average voltage root mean square Vrms value of approximately 62 mV, large enough to corrupt signals in the intended signal path.

Figure 3:
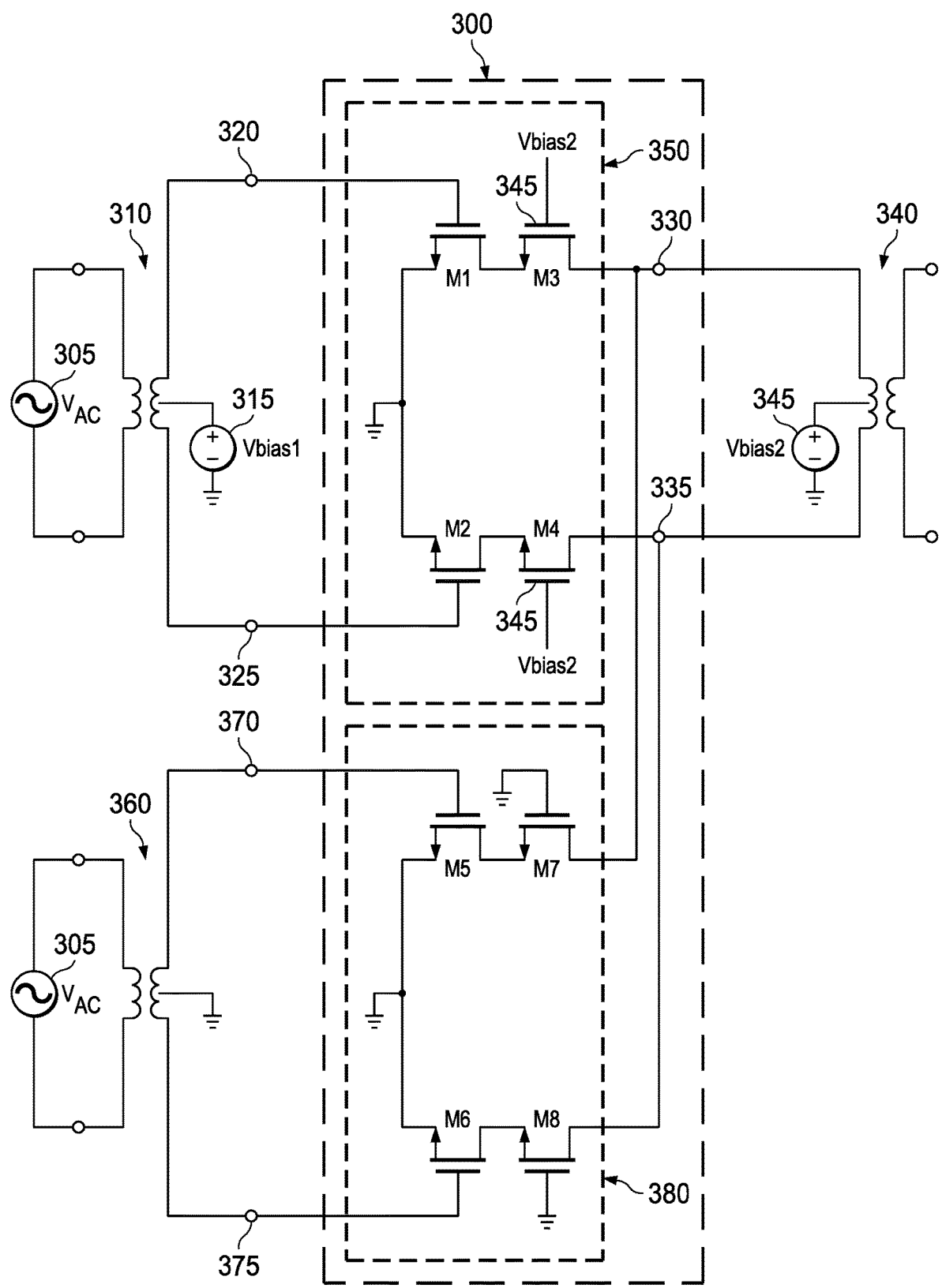
FIG. 3 illustrates a isolating cascode amplifier.

FIG. 3 illustrates two cascode amplifiers connected in parallel to create a signal path 300. A first cascode amplifier 350 in signal path 300 is similar to amplifier 200 shown in FIG. 2A in normal operating mode. The secondary winding of transformer 310 is biased to a voltage Vbias1 315 in both normal and isolating operating modes. The gate terminals of M3 and M4 are biased by a voltage Vbias2 345 to be turned on in both normal and isolating operating modes. A second cascode amplifier 380 in signal path 300 includes transistors M5-M8 and is similar to amplifier 200 in isolation operating mode. The gate terminals of M7 and M8 are coupled to ground. The cascode amplifiers 350 and 380 are coupled together in parallel at the outputs 330 and 335 of signal path 300, in a network configuration. Amplifier 350 is the intended signal path to outputs 330 and 335. Amplifier 380 is an alternative signal path that provides approximately 25 dB of isolation, which can be insufficient isolation to prevent signal corruption in the intended signal path.

In normal operating mode, the peak voltage swing of the output signals at outputs 330 and 335 from the drain terminals of M3 and M4, respectively, can be approximately 2.4V. In some implementations, the peak voltage swing is larger than the maximum gate-to-drain voltage Vgd rating for transistors M7 and M8 in cascode amplifier 380 and causes gate oxide breakdown in M7 and M8. In addition, grounding the gate terminals of M5 and M6 in amplifier 380 can cause significant changes to the input impedance of amplifier 380 at RF frequencies and corrupt the matching of the signal network prior to amplifier 380.

Figure 4:
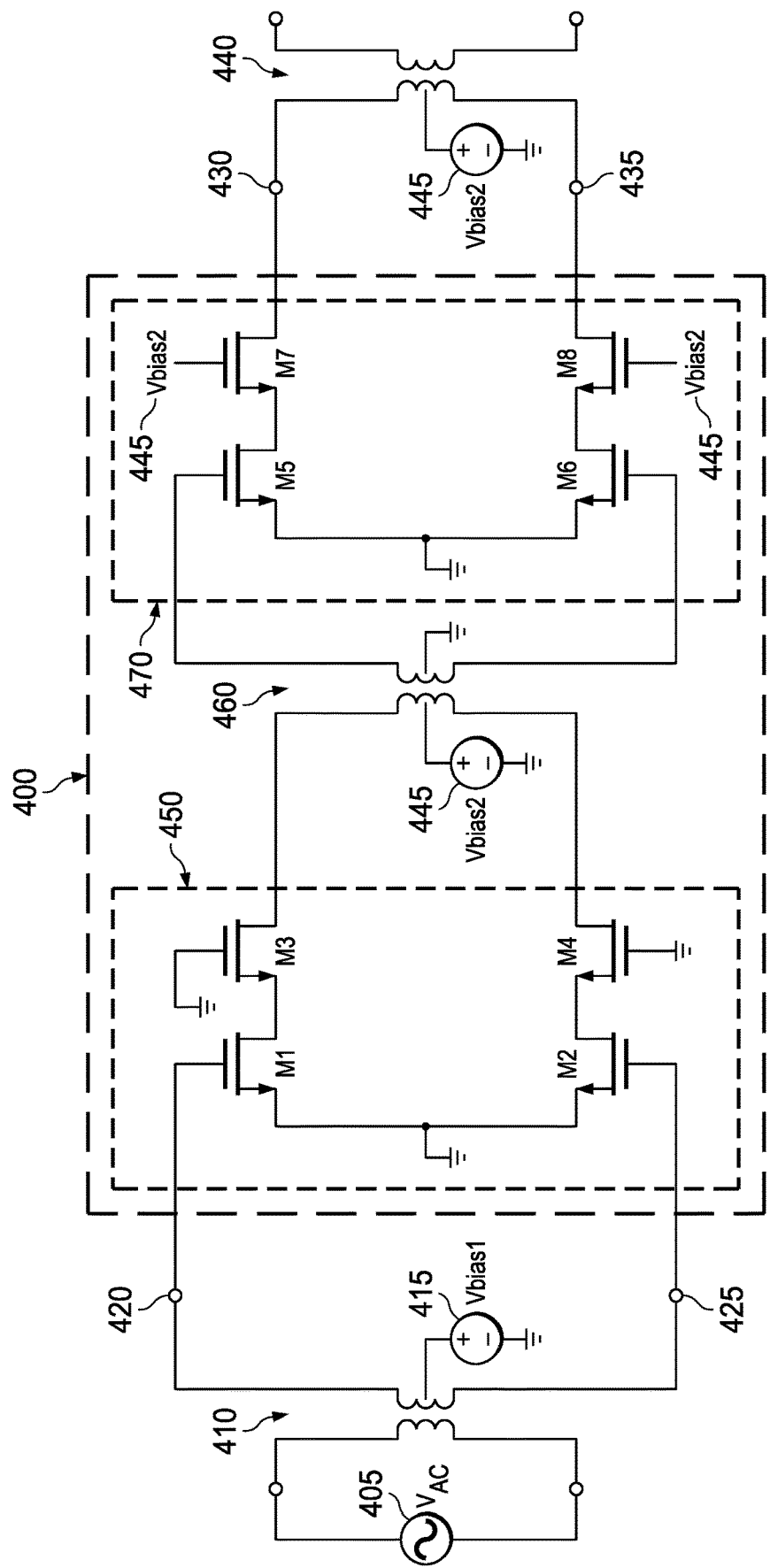
FIG. 4 illustrates a cascading amplifier with two stages.

FIG. 4 illustrates a cascading amplifier 400 with two stages in isolation mode. The first stage 450 includes transistors M1-M4, and the second stage 470 includes transistors M5-M8. The secondary winding of transformer 410 is biased by a voltage Vbias1 415, as are the gate terminals of M1 and M2 in the first stage 450, in both normal and isolation operating modes. The source terminals of M1 and M2 are coupled to ground in this implementation. In other examples, the source terminals of M1 and M2 are coupled to a current source. The gate terminals of M3 and M4 are coupled to ground in isolation mode and biased by a voltage Vbias2 445 in normal operating mode. The outputs of the first stage 450 are coupled to the primary winding of transformer 460, which is biased by Vbias2 445. The second stage 470 is coupled to the secondary winding of transformer 460, which is coupled to ground.

In the second stage 470, the gate terminals of M5 and M6 are coupled to ground in isolation mode and biased by Vbias2 445 in normal operating mode. The source terminals of M5 and M6 are coupled to ground in this implementation. In other examples, the source terminals of M1 and M2 are coupled to a current source. The gate terminals of M7 and M8 receive Vbias2 445, which biases M7 and M8 to be turned on in both normal and isolation operating modes. Because the gate voltages of M1-M2 in the first stage 450 and M7-M8 in the second stage 470 are constant, the input and output impedance matching and amplifier reliability are maintained whether the amplifier 400 is operating in normal or isolation mode. However, the two stages in series double the amplifier's power consumption in normal operating mode and occupy a large area of a semiconductor die including the amplifier 400.

Figure 5A:
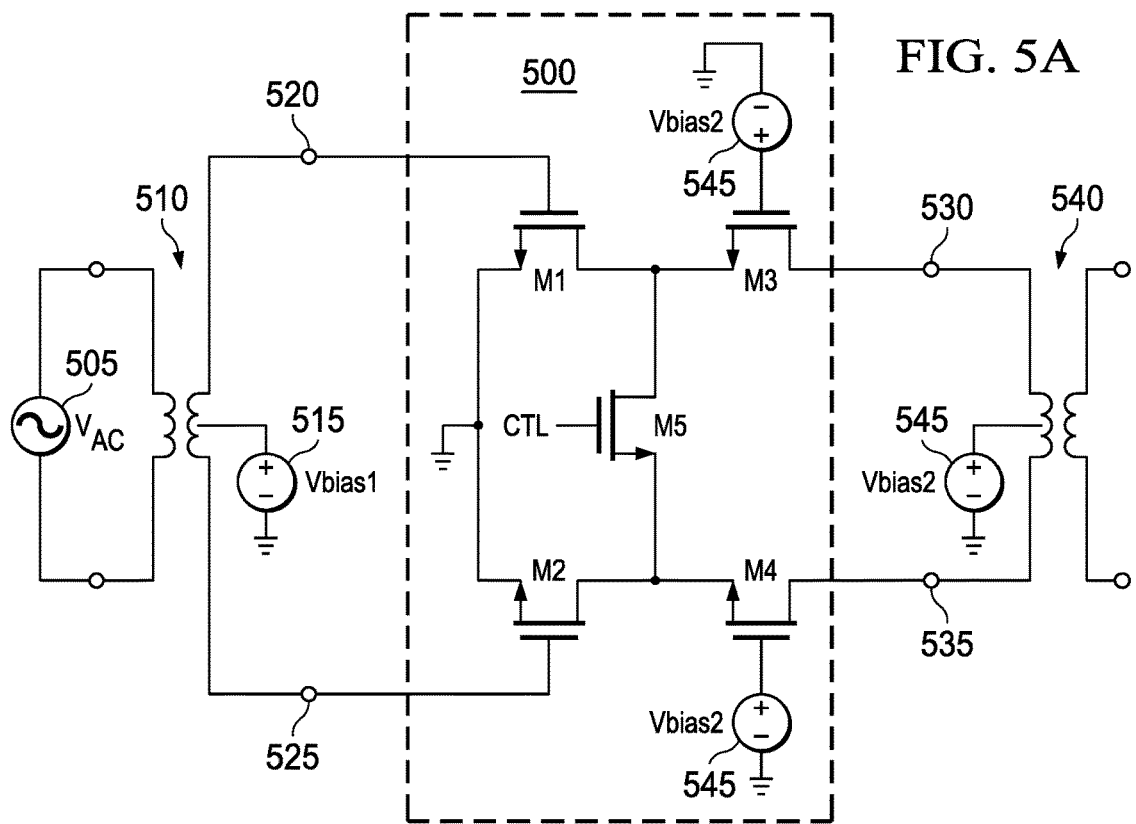
FIGS. 5A-B illustrate a cascode amplifier with a differential shorting switch and a plot of the amplifier output signals in an isolation mode of operation.
Figure 5B:
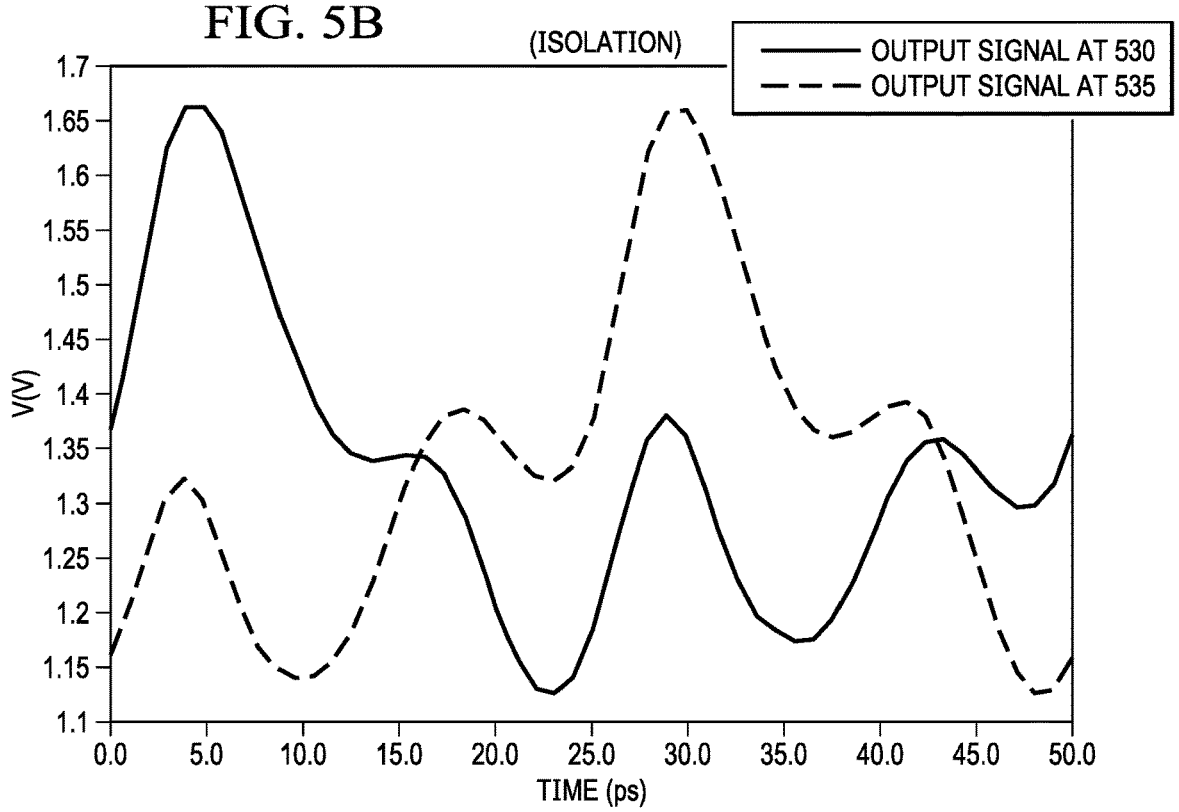

FIGS. 5A-B illustrate a cascode amplifier 500 with a differential shorting switch and a plot of the amplifier output signals in an isolation mode of operation. Amplifier 500 is similar to amplifier 200 shown in FIG. 2A in normal operating mode. The gate terminals of M3 and M4 are biased to be turned on in both normal and isolating operating modes, in this example by Vbias2 545. A transistor M5 acts as a differential shorting switch. The drain terminal of M5 is coupled to the drain terminal of M1 and the source terminal of M3. The source terminal of M5 is coupled to the drain terminal of M2 and the source terminal of M4.

The gate terminal of M5 receives a control signal CTL which biases M5 to be turned off in normal operating mode and turned on in isolation operating mode. FIG. 5B shows a plot of the amplifier output signals at outputs 530 and 535 in an isolation operating mode. In an isolation operating mode, RF signal leakage at outputs 530 and 535 can have an average Vrms value of approximately 219 mV. Amplifier 500 provides only approximately 14 dB of isolation. The differential shorting switch M5 can be made larger to improve the isolation of amplifier 500, but at the cost of increasing die area and increasing parasitic capacitance.

Figure 6A:
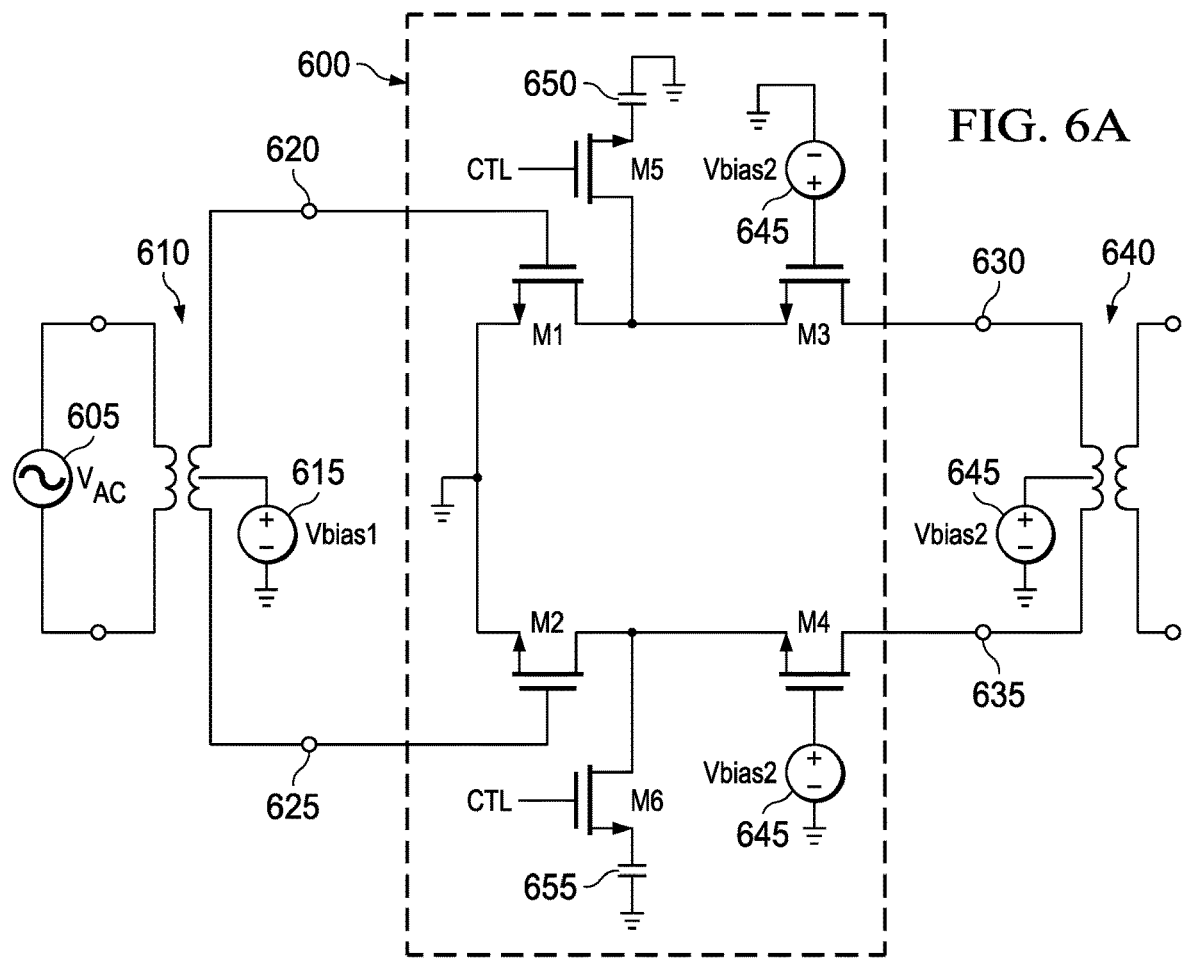
FIGS. 6A-B illustrate a cascode amplifier with AC shorting switches and a plot of the amplifier output signals in an isolation mode of operation.
Figure 6B:
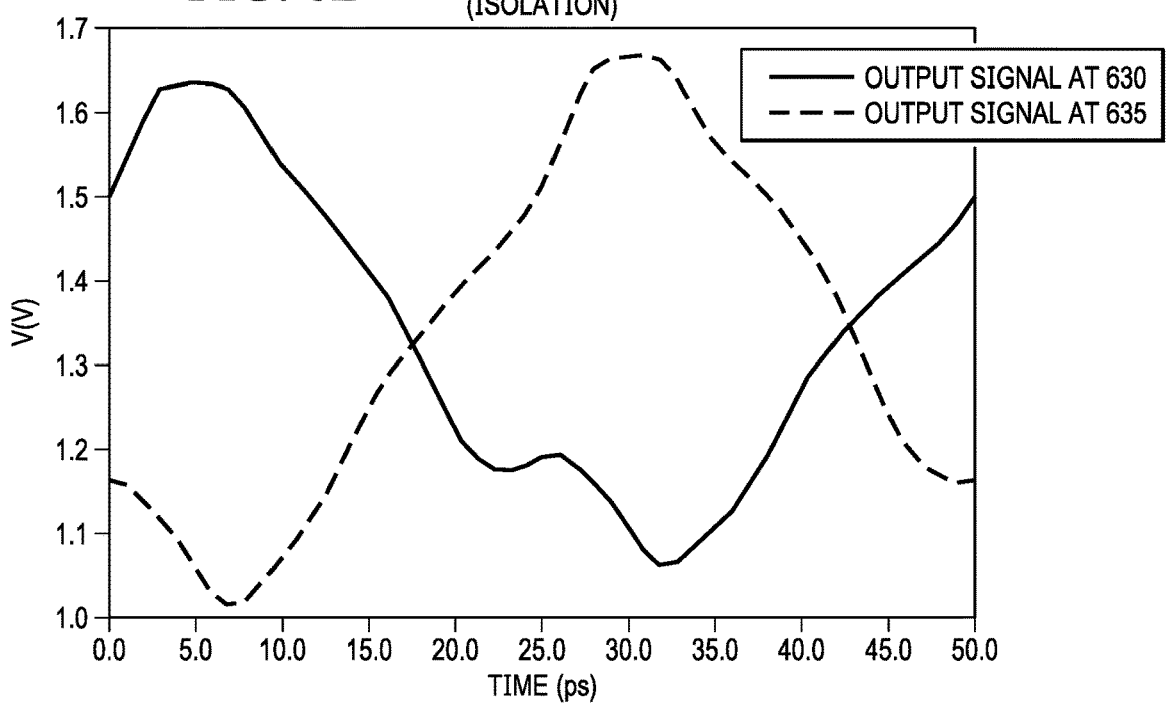

FIGS. 6A-B illustrate a cascode amplifier 600 with AC shorting switches and a plot of the amplifier output signals in an isolation mode of operation. Amplifier 600 is similar to amplifier 200 shown in FIG. 2A in normal operating mode. The gate terminals of M3 and M4 are biased to be turned on in both normal and isolating operating modes, in this example by Vbias2 645. Transistors M5 and M6 act as AC shorting switches. The drain terminal of M5 is coupled to the drain terminal of M1 and the source terminal of M3. The source terminal of M5 is coupled to a capacitor 650, which is further coupled to ground. The drain terminal of M6 is coupled to the drain terminal of M2 and the source terminal of M4. The source terminal of M6 is coupled to a capacitor 655, which is further coupled to ground. The gate terminals of M5 and M6 receive a control signal CTL, which biases M5 and M6 to be turned off in a normal operating mode and turned on in an isolation operating mode.

FIG. 6B shows a plot of the amplifier output signals at outputs 630 and 635 in an isolation operating mode. RF signal leakage at outputs 630 and 635 can have an average Vrms value of approximately 380 mV. Amplifier 600 provides only approximately 9 dB of isolation. The AC shorting switches M5 and M6 can be made larger to improve the isolation of amplifier 600, but at the cost of increasing die area and increasing parasitic capacitance. Similarly, the capacitance values of capacitors 650 and 655 can be increased to improve the isolation of amplifier 600, but also increase the die area occupied by the capacitors.

Figure 7A:
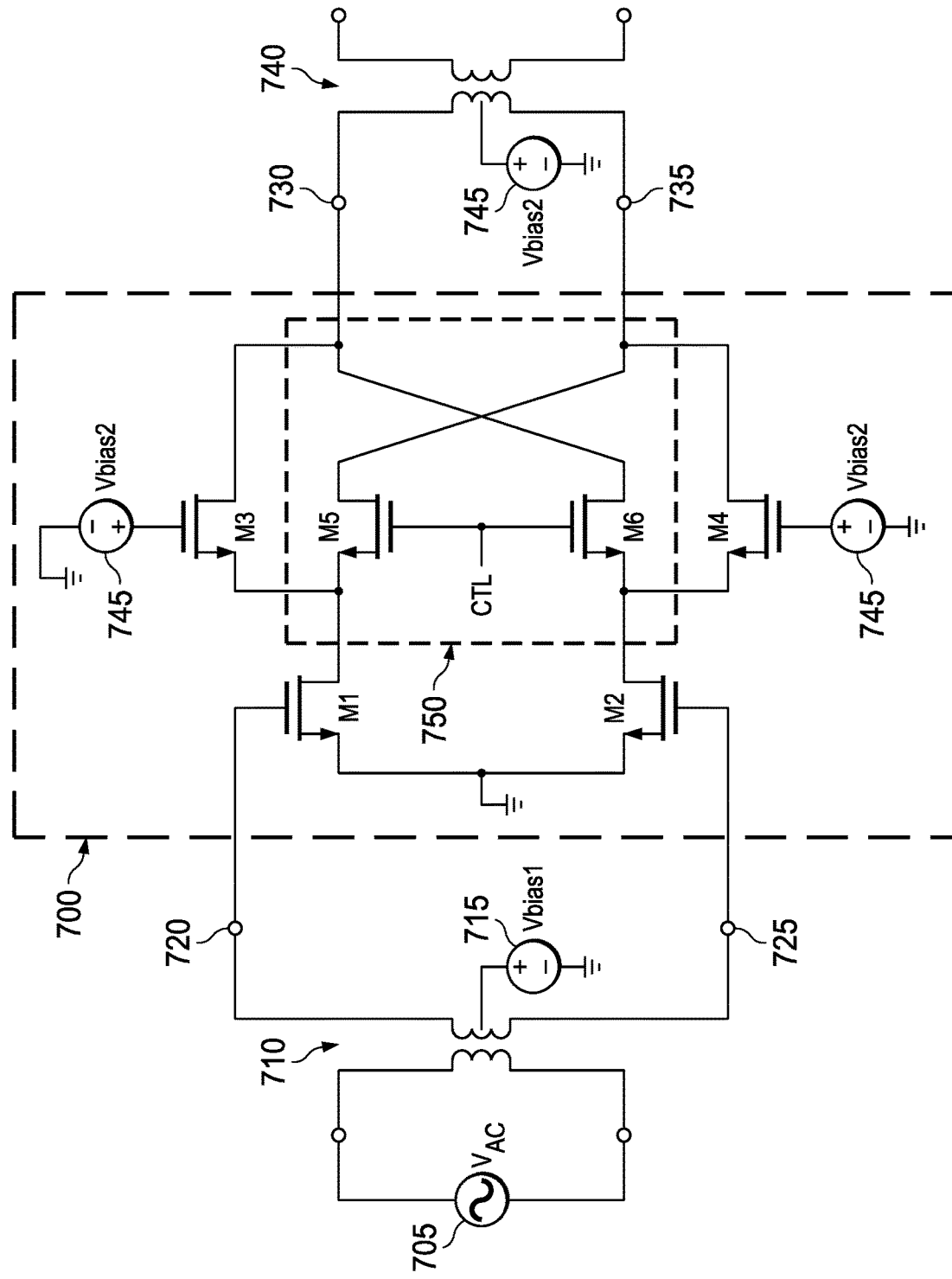
FIGS. 7A-E illustrate an example amplifier with a cancellation path and plots of the voltage and frequency spectrum of amplifier output signals in normal and isolation modes of operation.

FIGS. 7A-E illustrate an example amplifier 700 with a cancellation path and plots of the voltage and frequency spectrum of amplifier output signals in normal and isolation modes of operation. FIG. 7A shows the example amplifier 700. The signal source 705 is coupled to the primary winding of transformer 710. The secondary winding of transformer 710 is coupled to the inputs 720 and 725 of amplifier 700 and is biased by a voltage Vbias1 715 that is constant between both normal and isolation operating modes. The outputs 730 and 735 of amplifier 700 are coupled to the primary winding of transformer 740, which is biased by a voltage Vbias2 745 that is constant between normal and isolation operating modes.

Amplifier 700 includes transistors M1-M6, which are NMOS in this example. In other examples, one or more of M1-M6 are PMOS or bipolar junction transistors. The gate terminal of M1 is coupled to input 720 and the gate terminal of M2 is coupled to input 725. The source terminals of M1 and M2 are coupled to ground in this implementation. In other examples, the source terminals of M1 and M2 are coupled to a current source. The source terminal of M3 is coupled to the drain terminal of M1, and the source terminal of M4 is coupled to the drain terminal of M2. The gate terminals of M3 and M4 are biased to be turned on in both normal and isolation operating modes, in this example by Vbias2 745. The drain terminal of M3 is coupled to output 730, and the drain terminal of M4 is coupled to output 735.

Transistors M5 and M6 form a cancellation path 750. M5 forms a cancellation pathway from the first signal path, input 720 and M1, to output 735. Characteristics of M5 are chosen to match characteristics of M4, including threshold voltage Vth, geometry, rotation, and biasing. The source terminal of M5 is coupled to the drain terminal of M1 and the source terminal of M3. The drain terminal of M5 is coupled to output 735. M6 forms a cancellation pathway from the second signal path, input 725 and M2, to output 730. Characteristics of M6 are chosen to match characteristics of M3, including Vth, geometry, rotation, and biasing. The source terminal of M6 is coupled to the drain terminal of M2 and the source terminal of M4. The drain terminal of M6 is coupled to output 730.

Figure 7B:
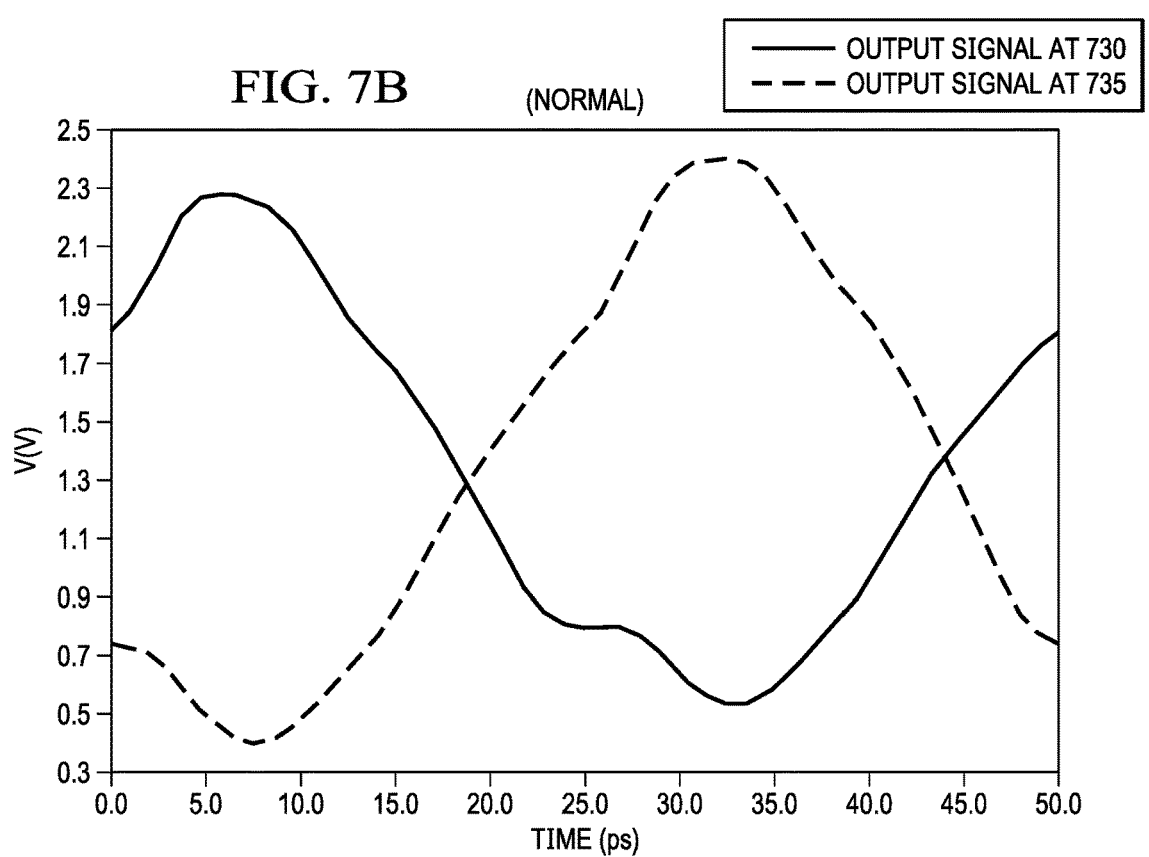
Figure 7C:
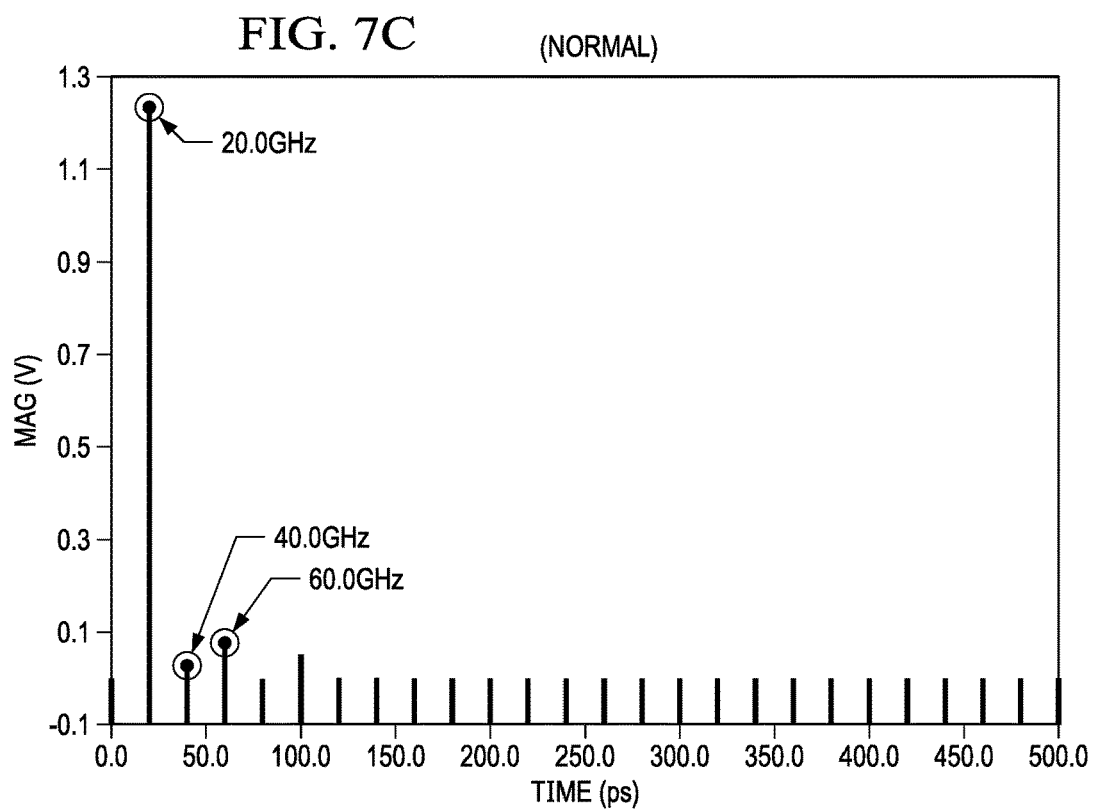

The gate terminals of M5 and M6 receive a control signal CTL that biases M5 and M6 to be turned on in an isolation operating mode and turned off in a normal operating mode. FIG. 7B shows a plot of the amplifier output signals at outputs 730 and 735 in a normal operating mode. M5 and M6 are turned off. The voltage swing of the output signals can be as high as 2.4V. FIG. 7C shows a plot of the spectrum of the amplifier output signals at outputs 730 and 735 in a normal operating mode, centered at approximately 20 GHz.

Figure 7D:
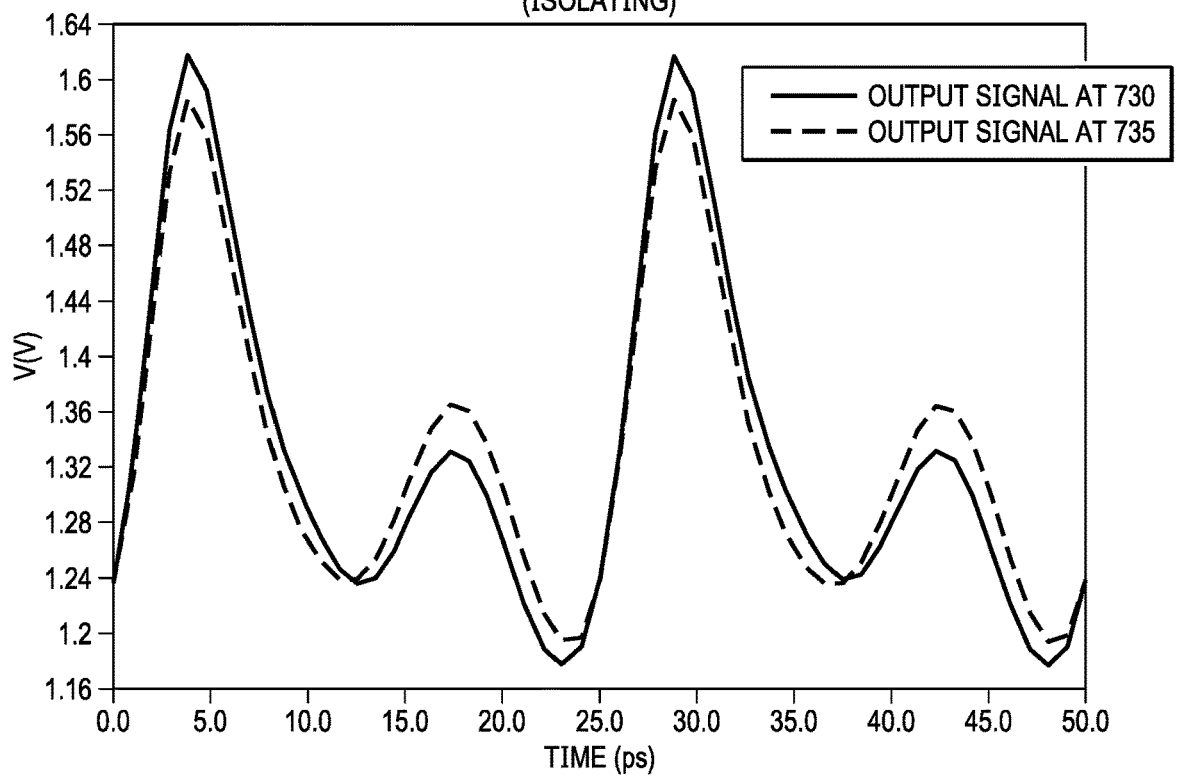
Figure 7E:
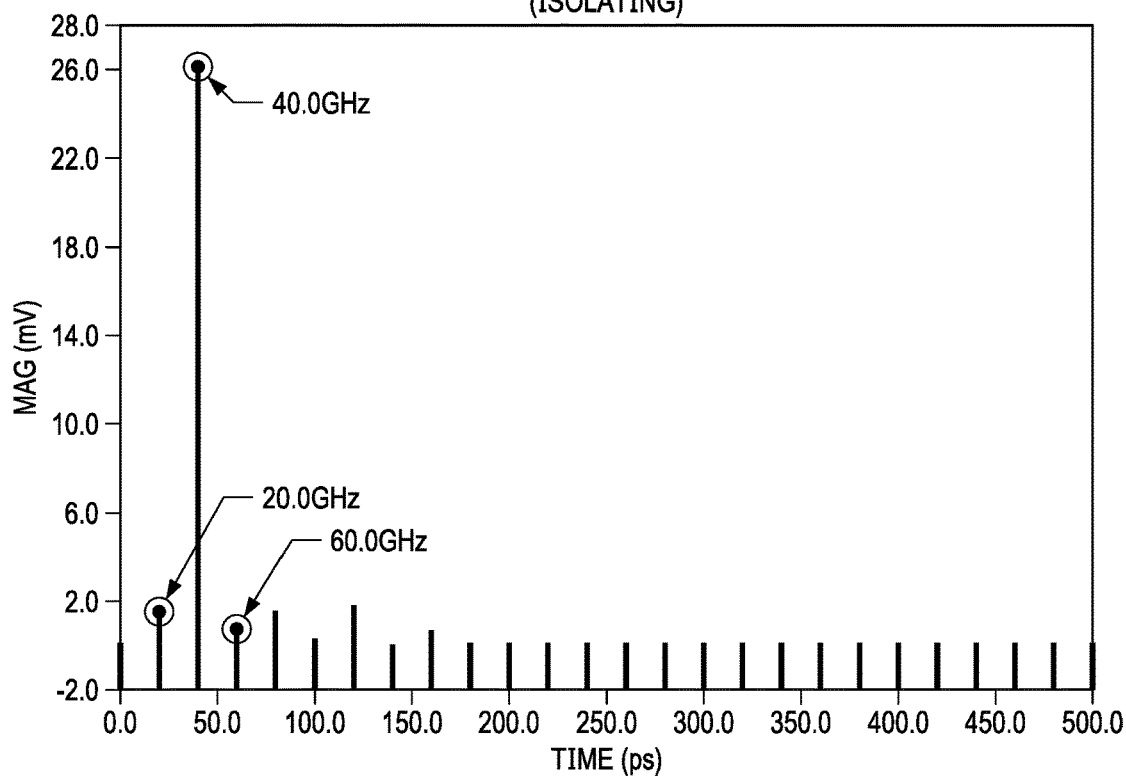

In isolation operating mode, CTL biases M5 and M6 to be turned on. M5 propagates a replica signal that is 180 degrees out of phase with the leakage signal through the second signal path, substantially cancelling it, and M6 propagates a replica signal that is 180 degrees out of phase with the leakage signal through the first signal path, substantially cancelling it. FIG. 7D shows a plot of the amplifier output signals at outputs 730 and 735 in an isolation operating mode. The replica signals through M5 and M6 substantially cancel out the leakage signals at outputs 730 and 735 and provide approximately 58 dB of isolation for amplifier 700. FIG. 7E shows a plot of the spectrum of the amplifier output signals at outputs 730 and 735 in isolation operating mode. Signal leakage at 20 GHz is less than 2 mV. The second harmonic at 40 GHz is filtered out by subsequent amplifier stages, which need not be modified to do so.

In some implementations, CTL biases M5 and M6 such that the gate-to-source voltages Vgs are less than Vth and the Vgd are less than the maximum Vgd rating, preventing gate oxide breakdown. In an example implementation, the maximum Vgd rating of M5 and M6 is approximately 2V, and the Vth for M5 and M6 is approximately 0.7V. The peak voltage swing of the signals at outputs 730 and 735 in normal operating mode is approximately 2.4V. In normal operating mode, CTL biases the gate terminals of M5 and M6 to approximately 0.6V, less than Vth=0.7V, keeping M5 and M6 turned off. The Vgd for M5 and M6 at the peak voltage is 1.8V, less than the 2V maximum Vgd rating.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An amplifier, comprising:
   a first transistor coupled to a first input;
   a second transistor coupled to a second input;
   a third transistor coupled to the first transistor and to a first output;
   a fourth transistor coupled to the second transistor and to a second output;
   a fifth transistor coupled to the first and third transistors and to the second output; and
   a sixth transistor coupled to the second and fourth transistors and to the first output, wherein the fifth and sixth transistors are biased to be off while the amplifier does not operate in an isolation mode.

2. The amplifier of claim 1, wherein characteristics of the fifth transistor match characteristics of the fourth transistor, wherein characteristics of the sixth transistor match characteristics of the third transistor, and wherein the characteristics include threshold voltage, geometry, rotation, and biasing.

3. The amplifier of claim 1, wherein the fifth and sixth transistors are biased to be on while the amplifier operates in an isolation mode.

4. The amplifier of claim 1, wherein the fifth and sixth transistors comprise metal oxide semiconductor field effect transistors and are biased such that a gate to drain voltage of the fifth and sixth transistors does not cause a gate oxide breakdown in the fifth and sixth transistors.

5. The amplifier of claim 1, wherein the third and fourth transistors are biased to be turned on.

6. The amplifier of claim 1, wherein the first and second inputs are configured to be coupled to a secondary winding of a transformer.

7. The amplifier of claim 1, wherein the first and second outputs are configured to be coupled to a primary winding of a transformer.

8. An amplifier, comprising:
a common emitter stage coupled to a first input and to a second input;
a common base stage coupled to the common emitter stage and to a first output and to a second output; and
a cancellation path coupled to the common emitter stage and the common base stage and to the first and second outputs, wherein the cancellation path is configured to:
generate, while the amplifier operates in an isolation mode, a first cancellation signal that is 180 degrees out of phase with a first leakage signal at the first output and a second cancellation signal that is 180 degrees out of phase with a second leakage signal at the second output; and
not generate, while the amplifier does not operate in the isolation mode, the first and second cancellation signals.

9. The amplifier of claim 8, wherein the cancellation path comprises:
a first cancellation transistor coupled to the common emitter stage and the common base stage and to the first output; and
a second cancellation transistor coupled to the common emitter stage and the common base stage and to the second output.

10. The amplifier of claim 9, wherein the first and second cancellation transistors are biased to be on while the amplifier operates in the isolation mode.

11. The amplifier of claim 9, wherein the first and second cancellation transistors are biased to be off while the amplifier does not operate in the isolation mode.

12. The amplifier of claim 11, wherein the first and second cancellation transistors comprise metal oxide semiconductor field effect transistors and are biased by a biasing voltage while the amplifier does not operate in the isolation mode, such that gate-to-source voltages of the first and second cancellation transistors are less than threshold voltages for the first and second cancellation transistors and such that gate-to-drain voltages of the first and second cancellation transistors are less than maximum gate-to-drain voltages for the first and second cancellation transistors.

13. The amplifier of claim 9, wherein the common emitter stage comprises:
a first transistor coupled to the first input and to the common base stage and the second cancellation transistor; and
a second transistor coupled to the second input and to the common base stage and the first cancellation transistor.

14. The amplifier of claim 9, wherein the common base stage comprises:
a first transistor coupled to the common emitter stage and the second cancellation transistor and to the first output; and
a second transistor coupled to the common emitter stage and the first cancellation transistor and to the second output.

15. The amplifier of claim 14, wherein the first and second transistors are biased to be turned on.

16. An amplifier, comprising:
a first transistor coupled to a first input;
a second transistor coupled to a second input;
a third transistor coupled to the first transistor and to a first output;
a fourth transistor coupled to the second transistor and to a second output;
a first cancellation path between the first and third transistors and the second output, wherein the first cancellation path is configured to:
generate a first cancellation signal that is 180 degrees out of phase with a first leakage signal through the second and fourth transistors while the amplifier operates in an isolation mode; and
not generate the first cancellation signal while the amplifier does not operate in the isolation mode; and
a second cancellation path between the second and fourth transistors and the first output, wherein the second cancellation path is configured to:
generate a second cancellation signal that is 180 degrees out of phase with a second leakage signal through the first and third transistors while the amplifier operates in the isolation mode; and
not generate the second cancellation signal while the amplifier does not operate in the isolation mode.

17. The amplifier of claim 16, wherein the first cancellation path comprises a first cancellation transistor coupled to the first and third transistors and to the second output, and wherein the second cancellation path comprises a second cancellation transistor coupled to the second and fourth transistors and to the first output.

18. The amplifier of claim 17, wherein characteristics of the first cancellation transistor match characteristics of the fourth transistor, wherein characteristics of the second cancellation transistor match characteristics of the third transistor, and wherein the characteristics include threshold voltage, geometry, rotation, and biasing.

* * * * *